(12) United States Patent
Yang et al.

(10) Patent No.: US 10,021,796 B2
(45) Date of Patent: Jul. 10, 2018

(54) ELECTRONIC CONTROL UNIT HAVING RIVET FIXTURE

(71) Applicant: HYUNDAI AUTRON CO., LTD., Seongnam-si (KR)

(72) Inventors: Sun Jae Yang, Uiwang-si (KR); Jun Ho Lee, Seoul (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 0 days.

(21) Appl. No.: 15/373,829

(22) Filed: Dec. 9, 2016

(65) Prior Publication Data
US 2017/0171994 A1 Jun. 15, 2017

(30) Foreign Application Priority Data
Dec. 9, 2015 (KR) .......................... 10-2015-0175133

(51) Int. Cl.
*H05K 5/00* (2006.01)
*H01R 13/52* (2006.01)
*H05K 7/14* (2006.01)

(52) U.S. Cl.
CPC ....... *H05K 5/0026* (2013.01); *H01R 13/5202* (2013.01); *H05K 5/0017* (2013.01);
(Continued)

(58) Field of Classification Search
CPC .. B60R 16/02; B60R 16/0239; H05K 5/0017; H05K 5/0026; H05K 5/0073;
(Continued)

(56) References Cited

U.S. PATENT DOCUMENTS 5,256,085 A * 10/1993 Tan ...................... H01R 12/716
439/372
5,473,509 A * 12/1995 Schoettl .............. B60R 16/0239
361/715
(Continued)

FOREIGN PATENT DOCUMENTS

JP 2013-232547 A 11/2013
KR 19980041626 U 9/1998
(Continued)

OTHER PUBLICATIONS

Korean Intellectual Property Office, Office Action for Korean patent application No. 10-2015-0175133, dated Jan. 2, 2017, Korea.

*Primary Examiner* — Timothy Thompson
*Assistant Examiner* — Guillermo Egoavil
(74) *Attorney, Agent, or Firm* — Baker McKenzie; Hyunho Park

(57) ABSTRACT

An electronic control unit according to the present invention includes an electronic control element which includes a printed circuit board that electrically controls respective components of a vehicle, and a heat radiating portion that is provided at one side of the printed circuit board, a housing which accommodates the electronic control element, a connector which connects the electronic control element and the vehicle, a sealing unit which seals a connecting portion between the electronic control element and the connector, and a fixing bracket, and further includes a rivet fastening means in order to fastened the housing and the fixing bracket.

4 Claims, 4 Drawing Sheets

(52) U.S. Cl.
CPC ......... *H05K 5/0073* (2013.01); *H05K 7/1402* (2013.01); *H05K 7/1427* (2013.01)

(58) Field of Classification Search
CPC ...... H05K 7/1402; H05K 7/1427; H05K 9/00; H05K 5/006; H05K 5/0039; H05K 5/0047; H05K 5/0052; H05K 7/20854; H01R 13/5202
USPC .................................................. 361/752, 759
See application file for complete search history.

(56) References Cited

U.S. PATENT DOCUMENTS

2004/0262471 A1* 12/2004 Mayer ................... H05K 5/0073
    248/218.4
2007/0284167 A1* 12/2007 Watanabe ............. B60L 3/0046
    180/68.5

FOREIGN PATENT DOCUMENTS

| KR | 10-1512398 B | 4/2015 | |
|----|----|----|----|
| KR | 101512398 B1 * | 4/2015 | ............. B60R 16/02 |
| KR | 101575265 B1 * | 12/2015 | ......... B60R 16/0239 |

* cited by examiner

ELECTRONIC CONTROL UNIT HAVING RIVET FIXTURE

CROSS-REFERENCE TO RELATED APPLICATIONS

This application claims priority to and the benefit of Korean Patent Application No. 10-2015-0175133 filed in the Korean Intellectual Property Office on Dec. 9, 2015, the entire contents of which are incorporated herein by reference.

TECHNICAL FIELD

The present invention relates to an electronic control unit, and more particularly, to an electronic control unit having a rivet fixture, in which a rivet structure is applied to a housing of the electronic control unit such that the housing is easily connected with a bracket, thereby improving assembly properties.

BACKGROUND ART

In general, an electronic control device such as an electronic control unit (ECU), which electronically controls various types of accessorial devices, is equipped in a vehicle. The electronic control device receives information from sensors or switches installed at several positions in the vehicle, and processes the received information to perform various electronic control operations.

For example, the electronic control device, such as the ECU, which controls states of an engine, an automatic transmission, an ABS, and the like of the vehicle by using a computer, serves to control all of the components in the vehicle, such as the automatic transmission, a driving system, a braking system, and a steering system.

The electronic control device such as the ECU has a structure that includes a housing having a cover at an upper side thereof and a base at a lower side thereof, and connectors for connecting a printed circuit board (PCB) accommodated in the housing with an external socket or the like.

The housing is structured to be assembled together with the PCB while covering the PCB, and in this case, the connector, which is positioned between the cover and the base when the cover and the base are assembled, has a sealing unit for sealing the connector, the cover, and the base. With the sealing unit, it is possible to prevent outside moisture or foreign substances from being introduced into the housing.

To fix the electronic control device to the vehicle, the housing of the electronic control device is fastened to a fixing bracket provided on the vehicle by using a method of coupling bolts and nuts, welding, and the like, but there is a problem in that separate fastening holes need to be provided to couple the bolts and the nuts, and the bolts and the nuts are loosened due to vibration in the vehicle. The method of fastening the housing of the electronic control device by welding causes difficulty since an additional process is required because of the nature of the welding work, and makes it difficult for the housing of the electronic control device to be maintained or repaired.

The housing and the fixing bracket may not be securely fastened in accordance with a work state when the housing and the fixing bracket are connected, and in the case of fastening the fixing bracket directly to the housing by using the bolts, there is a problem in that high fastening force cannot be obtained because of a small contact area between the bolt and the housing.

LITERATURE OF RELATED ART

Patent Literature (Patent Literature 1) Korean Utility Model Application Laid-Open No. 1998-041626 (published on Sep. 25, 1998)

SUMMARY OF THE INVENTION

The present invention has been made in an effort to provide an electronic control unit in which a rivet structure is applied to a housing of the electronic control unit such that the housing is easily fastened to a fixing bracket, thereby obtaining fastening rigidity.

An exemplary embodiment of the present invention provides an electronic control unit including a housing having an internal space in which a printed circuit board for electrically controlling respective components of a vehicle is mounted, in which a rivet fixture mounting unit, which is separated from the internal space, is integrally formed on the housing, and a rivet fixture is coupled to the rivet fixture mounting unit.

Screw threads may be formed on an inner circumferential surface of the rivet fixture.

The rivet fixture mounting unit may have a container shape separated from the internal space, and may be provided on the housing.

The housing may be extruded to have a predetermined profile, and the rivet fixture mounting unit may be extruded together with the housing.

A fixing bracket, which fixes the electronic control unit to a vehicle side, may be fixed to the housing by coupling a bolt to the rivet fixture.

The electronic control unit according to the present invention may reduce an economic loss caused by additional work and ensure work safety and structural reliability, by improving a structure and enabling the fixing bracket and the electronic control unit to be easily and securely connected.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
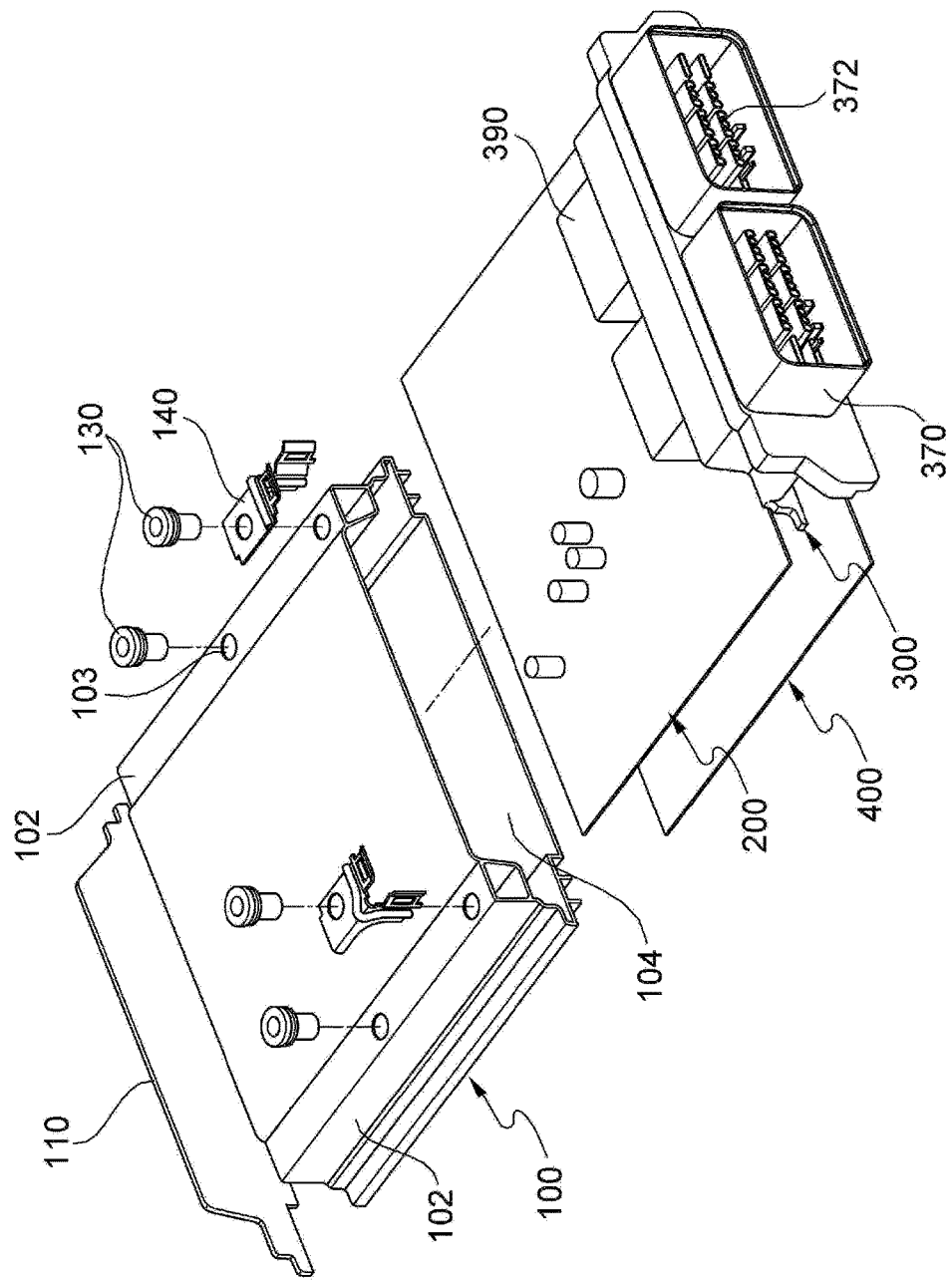
FIG. 1 is an exploded perspective view of an electronic control unit according to the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout several figures of the drawing.

DETAILED DESCRIPTION

Hereinafter, an electronic control unit according to an exemplary embodiment of the present invention will be described in detail with reference to the accompanying drawings so that those skilled in the art to which the present invention pertains may easily carry out the exemplary embodiment. The present invention is not limited to the exemplary embodiments described herein, and may be embodied in various different forms. A part irrelevant to the description will be omitted to clearly describe the present invention, and the same or similar constituent elements will be designated by the same reference numerals throughout the specification.

Figure 2:
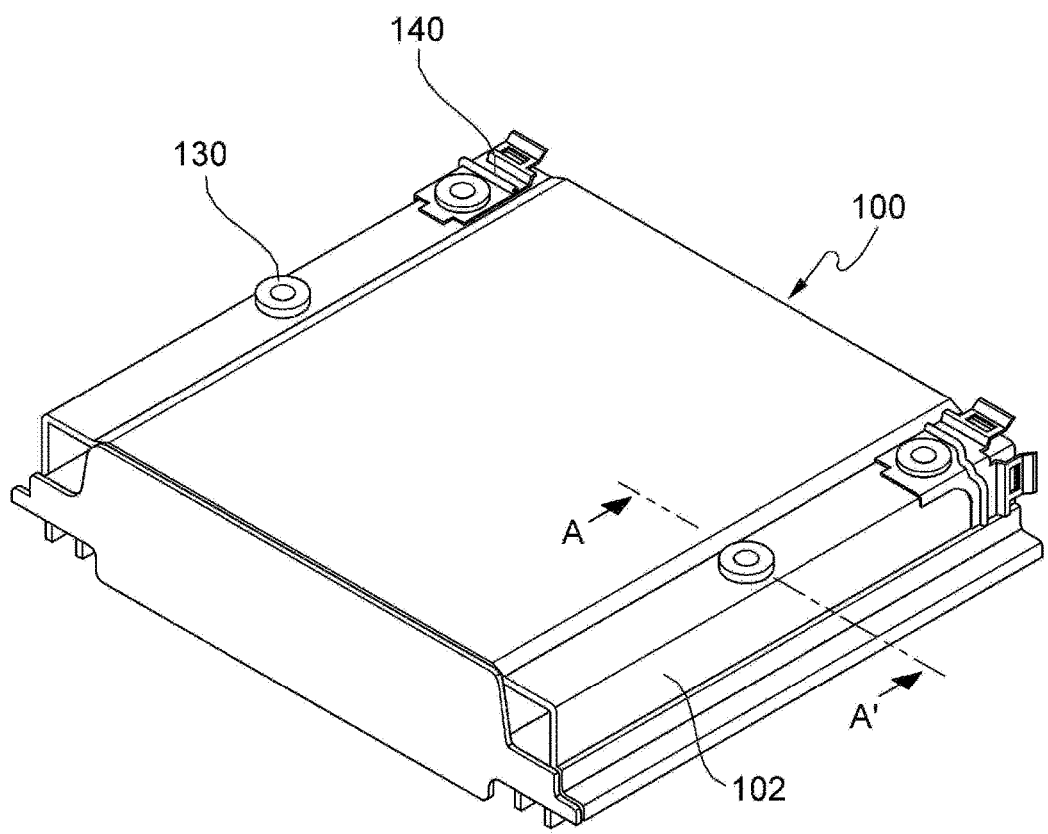
FIG. 2 is a perspective view of a housing of the electronic control unit according to the present invention.

FIG. 1 is a perspective view illustrating a state in which an electronic control unit according to the present invention is disassembled, and FIG. 2 is a perspective view illustrating a housing of the electronic control unit according to the present invention.

Referring to FIG. 1, the electronic control unit includes a printed circuit board 200, a connector 300 connected to the printed circuit board, and a housing 100 in which the printed circuit board 200 is mounted. A heat radiating film 400 for radiating heat may be provided at a lower side of the printed circuit board 200, and a sealing unit for sealing the housing 100 and the connector 300 may be provided. A back cover 110 may be further provided at a rear end portion of the housing 100.

A front portion of the connector 300 is defined as a connector front end portion 370, and a plurality of outer pins 372 provided at the connector front end portion 370 is connected to respective elements in a vehicle. A rear portion of the connector 300 is defined as a connector rear end portion 390, and the connector rear end portion 390 is provided with a plurality of inner pins (not illustrated) which is inserted into the housing 100 and connected with the PCB 200.

The back cover 110 may be fastened to the housing 100 by welding, and in some instances, the back cover 110 and the housing 100 may be manufactured in one piece or may be provided to be selectively separated from each other. The connector 300, which connects an electronic control element such as the PCB 200 with the vehicle, is positioned at one side of the housing 100, and the sealing unit for sealing is provided between the housing 100 and the connector 300.

The housing 100 may be made of metal such as aluminum or an aluminum alloy. The housing 100 may be manufactured by an extrusion method so as to have a predetermined profile.

In the present invention, the housing 100 has an internal space 104 into which the PCB 200 is inserted, and rivet fixture mounting units 102 which are separated from the internal space.

The housing 100 may be made of metal such as aluminum, and may be manufactured by an extrusion method so as to have a predetermined profile. The housing 100 is provided to be opened at one side and at the other side so that the electronic control element such as the PCB 200 is inserted into the housing 100, and the other side of the housing 100 may be closed by a blocking member such as the back cover 110 or selectively opened.

The rivet fixture mounting units 102 are formed to be separated from the internal space 104. The rivet fixture mounting unit 102 may be formed in a plate shape that protrudes at one side of the housing 100. In particular, the rivet fixture mounting unit 102 may be formed at a side of the housing 100 so as to have a vacant container shape. The rivet fixture mounting unit 102 may be formed in a longitudinal direction of the housing 100. Therefore, in a case in which the housing is manufactured by an extrusion method, the rivet fixture mounting unit 102 may be easily manufactured by adding a profile, which corresponds to the rivet fixture mounting unit 102, to the profile that defines the internal space 104. In some instances, the rivet fixture mounting unit 102 may be formed by welding a plate to a side portion of the housing 100 after the housing 100 including the internal space 104 is manufactured.

Rivet fixtures 130 are coupled to the rivet fixture mounting units 102. In one exemplary embodiment, rivet fixture coupling holes 103 are formed in the rivet fixture mounting units 102, and then the rivet fixtures 130 may be fixed to the rivet fixture coupling holes 103.

As illustrated in FIGS. 1 and 2, separate structures 140, which need to be fixed to the housing 100, may also be fixed while the rivet fixtures 130 are fixed to the rivet fixture mounting units 102.

Figure 3:
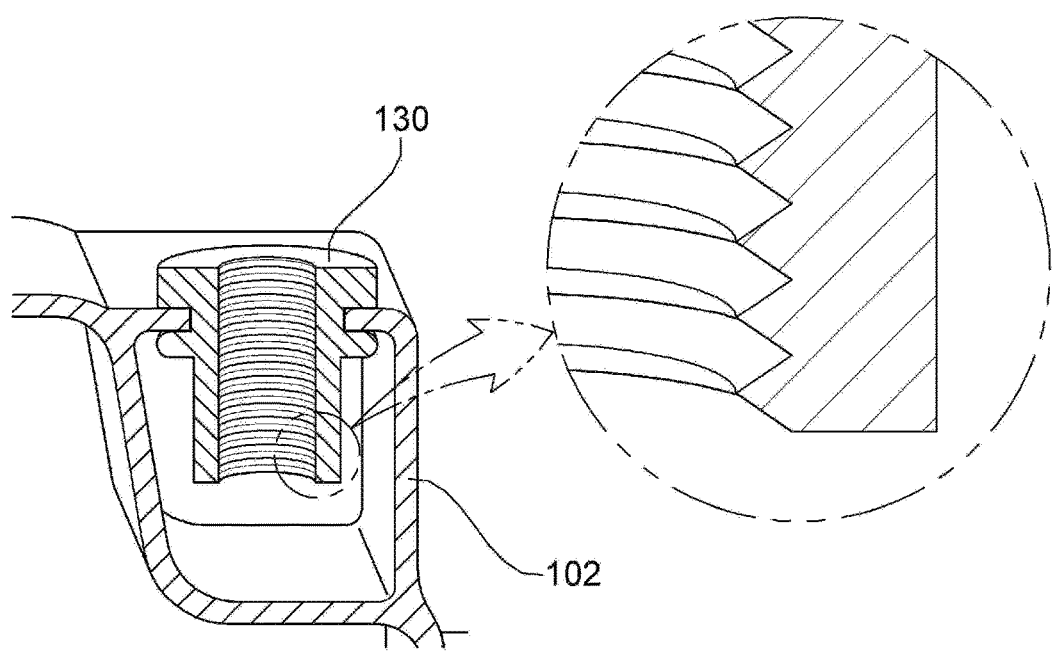
FIG. 3 is an enlarged cross-sectional view of a rivet fixture in a cross section taken along line A-A' in FIG. 2.

FIG. 3 is an enlarged cross-sectional view of the rivet fixture in a cross section taken along line A-A' in FIG. 2.

The rivet fixture 130 is coupled to the rivet fixture mounting unit 102. Screw threads may be formed in the rivet fixture 130.

A shape of the rivet fixture 130 or a structure fixed to the rivet fixture mounting unit 102 may be modified in various shapes without departing from the subject matter of the present invention. As an example of a method of configuring the rivet fixture 130, a structure, which fixes a rivet to a plate similarly to a "rivet nut unit" disclosed in Korean Patent Application Laid-Open No. 2015-0018131, may be exemplified.

Figure 4:
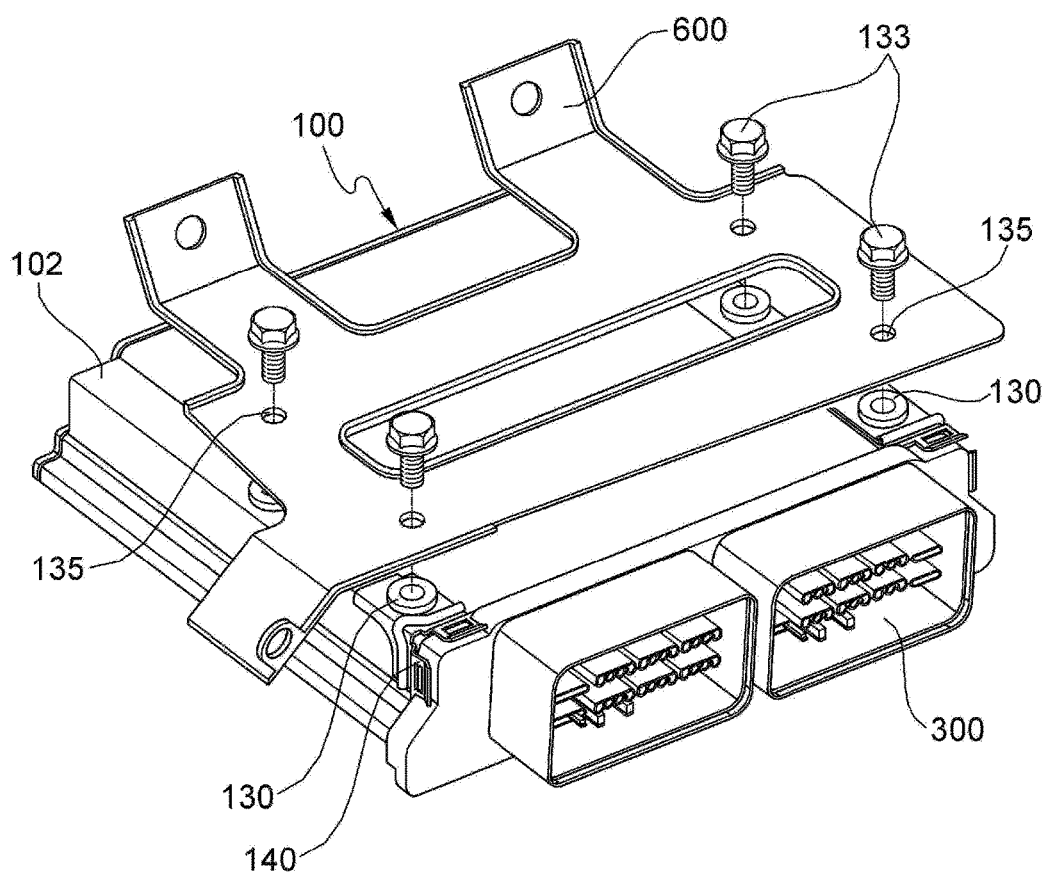
FIG. 4 is a perspective view for explaining a state in which the housing and a fixing bracket are fastened in accordance with the present invention.

FIG. 4 is a perspective view for explaining a state in which the housing and a fixing bracket are fastened in accordance with the present invention.

As illustrated in FIG. 4, the housing 100 and a fixing bracket 600 may be coupled to each other by coupling bolts 133 to the rivet fixtures 130, which each have the screw threads formed on an inner circumferential surface thereof, through fastening holes 135. In some instances, various fastening means other than the bolt 133 may be fixed to the rivet fixture 130.

A process of fastening the housing 100 and the fixing bracket 600 in accordance with the present invention will be described below. First, the rivet fixture coupling holes 103 are formed in the rivet fixture mounting units 102 of the housing 100, and the rivet fixtures 130 are then inserted into and fixed to the rivet fixture coupling holes 130. The screw threads may be formed on the inner circumferential surface of the rivet fixture 130.

The plurality of rivet fixtures 130 may be formed on the rivet fixture mounting units 102 of the housing 100, and two pairs of rivet fixtures 130 may be provided along sides of an upper end portion of the housing 100 as illustrated. As separate structures, hook brackets 140 may be fixed between the housing 100 and the rivet fixture 130 at a front side of the housing 100 which is adjacent to the connector 300. The hook bracket 140 is used to allow the rivet fixture 130 and the housing 100 to be securely fastened to each other, or used to fasten or seal connecting portions with the connector 300 and other electronic control elements as necessary.

The rivet fixture 130 may be provided on an upper side of the housing 100, and in some instances, the rivet fixture 130 may also be provided at a lateral side of the housing 100, and as a result, the rivet fixture 130 may be additionally and securely fastened to the fixing bracket 600 or a fixing means (not illustrated) for a vehicle.

That is, as illustrated, the housing 100 is fastened to the fixing bracket 600 at the vehicle side at four points at the upper side of the housing 100, and further, a lateral side or a bottom side of the housing 100 is also fastened to the vehicle by using the rivet fixture 130, such that the electronic control unit may be operated robustly against vibration or impact of the vehicle.

A height, an interval, and a diameter of the screw threads formed on the inner circumferential surface of the rivet fixture 130 may be modified so that the height, the interval, and the diameter may be selected in use, and may be selected in accordance with an environment in which the electronic control unit is installed and a position of the vehicle.

That is, strength of connection with the vehicle may vary based on a size or an installation position of the electronic control unit, and a size of a space in which the electronic control unit is installed may vary, and as a result, in a case in which the electronic control unit needs to be installed in a narrow space by changing the height and the size of the screw threads, the electronic control unit may be installed by decreasing sizes of the bolts and the screw threads.

A washer (not illustrated) or a seal may be additionally provided between the bolt 133 and the fixing bracket 600 in order to securely fasten the bolt 133 and prevent the bolt 133 from being loosened, and various connecting and fastening means, which may be substituted for the bolt, may be used as described above.

The electronic control unit according to the present invention may be used for an electronic control unit which may obtain effects of making work easy and reducing costs by applying an improved structure and effectively fastening the housing and the fixing bracket.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control unit comprising:
a housing having an internal space in which a printed circuit board for electrically controlling respective components of a vehicle is mounted,
wherein a rivet fixture mounting unit, which is separated from the internal space, is integrally formed on the housing, and a rivet fixture is coupled to the rivet fixture mounting unit, and
wherein the rivet fixture mounting unit has a container shape separated from the internal space, and is provided on the housing.

2. The electronic control unit of claim 1, wherein screw threads are formed on an inner circumferential surface of the rivet fixture.

3. The electronic control unit of claim 1, wherein the housing is extruded to have a predetermined profile, and the rivet fixture mounting unit is extruded together with the housing.

4. The electronic control unit of claim 1, wherein a fixing bracket, which fixes the electronic control unit to a vehicle side, is fixed to the housing by coupling a bolt to the rivet fixture.

* * * * *